United States Patent [19]

Nakata et al.

[11] Patent Number: 4,546,376
[45] Date of Patent: Oct. 8, 1985

[54] DEVICE FOR SEMICONDUCTOR INTEGRATED CIRCUITS

[75] Inventors: Toshikazu Nakata; Takashi Toida, both of Tokorozawa, Japan

[73] Assignee: Citizen Watch Co., Ltd., Tokyo, Japan

[21] Appl. No.: 537,535

[22] Filed: Sep. 30, 1983

[51] Int. Cl.$^4$ .............................................. H01L 29/78
[52] U.S. Cl. ...................... 357/23.7; 357/4; 357/55
[58] Field of Search .......... 357/23.7, 4, 55, 38

[56] References Cited

U.S. PATENT DOCUMENTS 3,586,932  6/1971  Kokosa ........................... 357/55 X
3,643,136  2/1972  Tuft ................................. 357/55 X
4,054,895  10/1977  Ham ................................ 357/23.7
4,110,780  8/1978  Cornu ............................. 357/55 X Primary Examiner—Martin H. Edlow
Attorney, Agent, or Firm—Birch, Stewart, Kolasch & Birch

[57] ABSTRACT

A device for semiconductor integrated circuits having a silicon single crystal film formed on a sapphire substrate by hetero epitaxy and isolated islands having side planes. One of the side planes makes an angle of 65° or more with the surface of the sapphire substrate at a part at least more than half thickness from the surface of the silicon single crystal film and makes an angle of 55° or less at a residual thickness.

2 Claims, 8 Drawing Figures

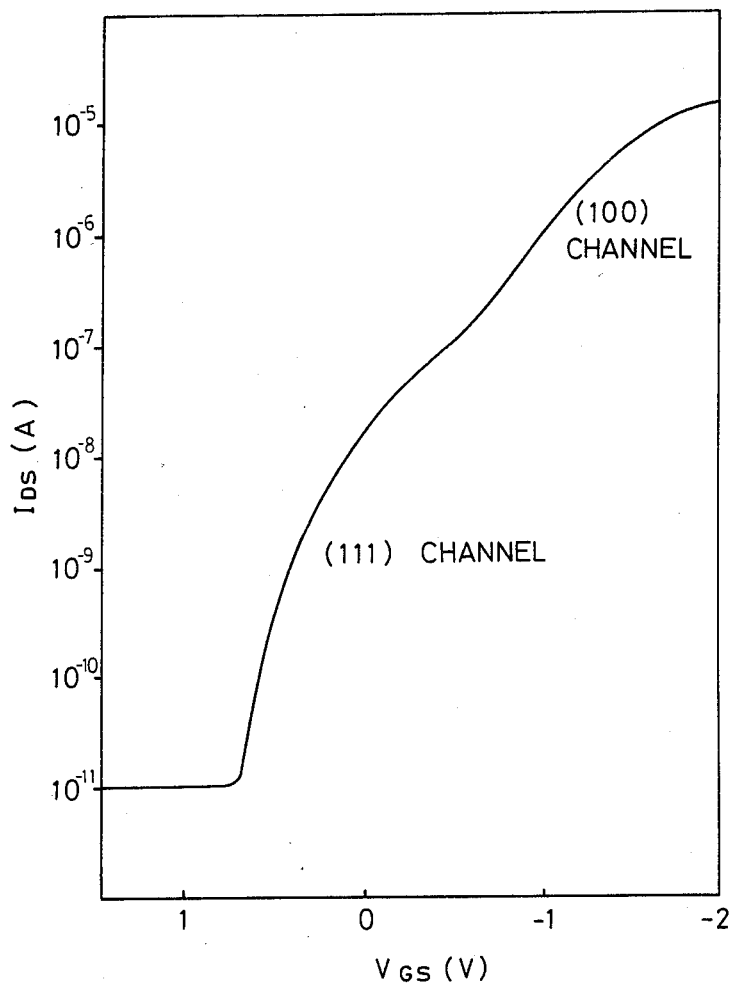

DEVICE FOR SEMICONDUCTOR INTEGRATED CIRCUITS

BACKGROUND OF THE INVENTION

The present invention relates to a device for semiconductor integrated circuits, and more particularly to an improvement of a MOS transistor in an integrated circuit having a substrate of silicon single crystal thin film provided on a sapphire substrate (hereinafter called SOS device) by hetero epitaxy.

SUMMARY OF THE INVENTION

An object of the present invention is to provide an SOS device having low power consumption without increasing manufacturing cost.

Another object of the present invention is to provide an SOS device, power consumption of which can be decreased by reducing abnormal drain current of a MOS transistor without decreasing the gate breakdown voltage thereof.

According to the present invention, there is provided a device for semiconductor integrated circuits having a silicon single crystal film formed on a sapphire substrate by hetero epitaxy and isolated islands having side planes, wherein one of the side planes makes an angle of 65° or more with the surface of the sapphire substrate at a part at least more than half thickness from the surface of the silicon single crystal film and makes an angle of 55° or less at a residual thickness.

These and other objects and features of the present invention will become more apparent from the following description with reference to the accompanying drawings.

BRIEF DESCRIPTION OF THE DRAWINGS

FIG. 1b is a sectional view taken along X—X of FIG. 1a;

FIG. 2 is a graph showing gate voltage and drain current characteristics of the SOS-MOS transistor;

DESCRIPTION OF THE PREFERRED EMBODIMENTS

Figure 1A:
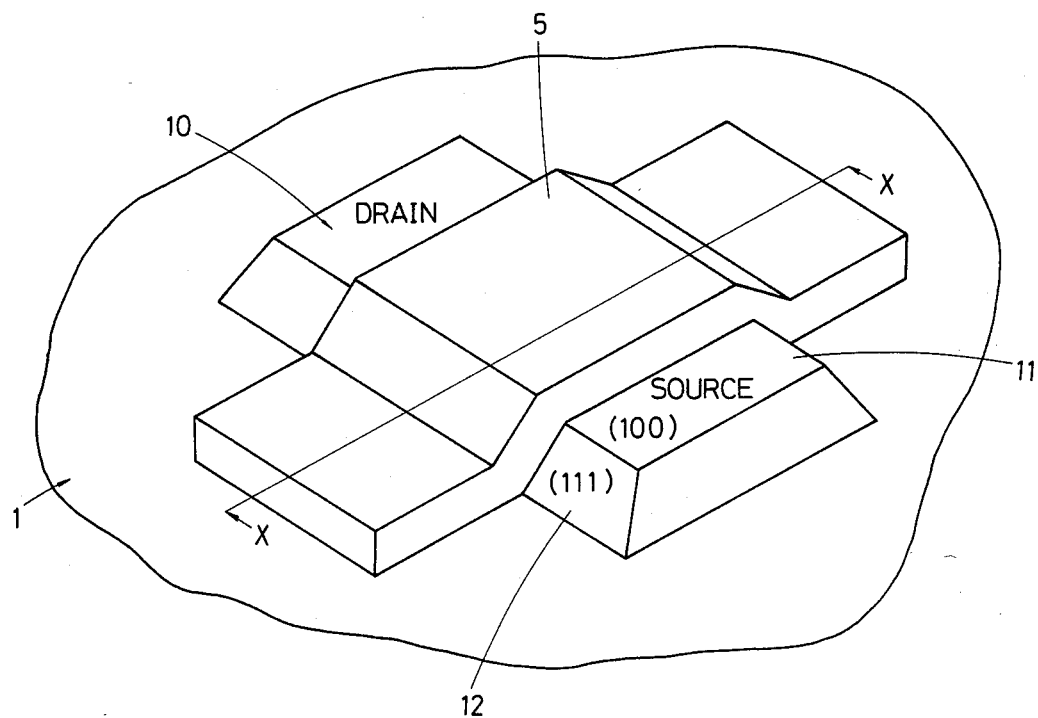
FIG. 1a is a perspective view of a conventional MOS transistor constituting a part of an SOS device.
Figure 1B:
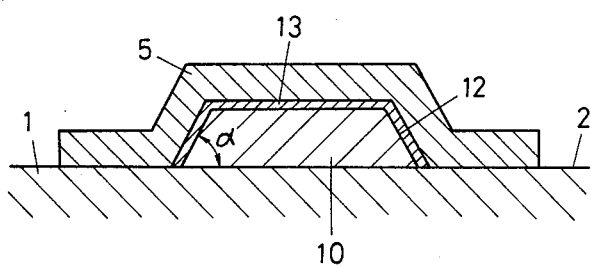

FIG. 1a shows a MOS transistor constituting a part of an SOS device. Conventionally, a sapphire having parameter ratio (1 $\bar{1}$ 0 2) is employed as a substrate 1. A silicon single crystal thin film is formed on a sapphire substrate 1 by epitaxial growth, a top plane 11 of which has crystal orientation (parameter ratio) of (1 0 0). As shown in FIG. 1a, when the silicon single crystal thin film 10 is isolated into islands by wet-type etching process of a photoetching method, a side plane 12 having crystal orientation of (1 1 1) is formed by selectivity at the wet-type etching process. Thus, channels under a gate 5 are formed with a principal channel in the top plane 11 of (1 0 0) and a sub-channel in the side plane 12 of (1 1 1). As shown in FIG. 1b, a tapering angle $\alpha$ made by the surface 2 of the sapphire substrate with the side plane 12 of the island is 54.7 degree. In FIG. 1b, numeral reference 13 is a gate oxide.

FIG. 2 shows a typical example of gate voltage $V_{GS}$ and drain current $I_{DS}$ characteristics of the SOS-MOS transistor. It will be seen that the characteristics are composite of the principal channel of (1 0 0) and the sub-channel of (1 1 1). As a result, because of abnormal drain current caused by the sub-channel, for example, when $V_{GS}$ is zero, value of $I_{DS}$ becomes very large compared with a proper value.

In order to eliminate such disadvantages, various methods have been employed. One of the methods is that impurity atoms are injected into the side plane (1 1 1) by ion implantation so as to increase the impurity atom concentration of the plane 12. Consequently, the threshold voltage of the sub-channel is raised, so that the abnormal drain current produced in the plane (1 1 1) is lowered. Another method is that a silicon dioxide layer is embedded between islands comprising a silicon single crystal to provide a selective oxidized structure. These methods are effective to lower the abnormal drain current. However, the manufacturing process is diverse and complicated so that the manufacturing cost increases substantially.

Recently, with the progress of miniaturization of the semiconductor integrated circuit device, a reactive ion etching (hereinafter called RIE) is practically used. The RIE is a combined etching process of a chemical dry-type etching by radical and a physical dry-type etching by sputtering. By controlling both etching processes, a side plane can be formed into a desirable sectional shape. The RIE is employed to form a device of the present invention.

Figure 3:
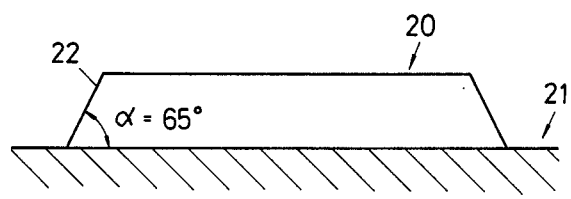
FIG. 3 is a side view showing an island of a silicon thin film on a sapphire substrate performed by reactive ion etching.

Referring to FIG. 3 showing an example of a silicon film, a silicon single crystal thin film 20 on a sapphire substrate 21 is shaped into an island by RIE. In the process, a cathode coupling-type RIE device of high frequency as 13.56 MHz is used and a mixed gas of CF$_3$Br and O$_2$ is used as reactive gas. The etching is performed at flows of CF$_3$Br of 150 SCCM and of O$_2$ of 50 SCCM, high frequency power density of 0.16 w/cm$^2$, and pressure of 10 Pascal. A tapering angle $\alpha$ made by the surface of the sapphire substrate 21 with a side plane 22 of the silicon single crystal thin film 20 is 65°.

Figure 4:
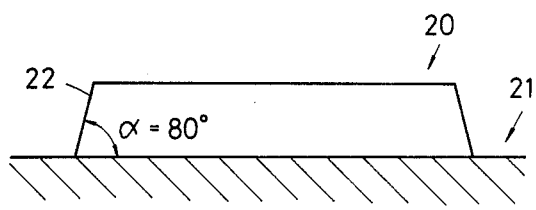
FIG. 4 is a side view showing an island of a silicon thin film on a sapphire substrate performed by a different etching condition.

In an example of FIG. 4, the flow of O$_2$ is changed to 15 SCCM and other conditions are the same as the embodiment of FIG. 3. A tapering angle $\alpha$ of the film of FIG. 4 is 80°.

Figure 5:
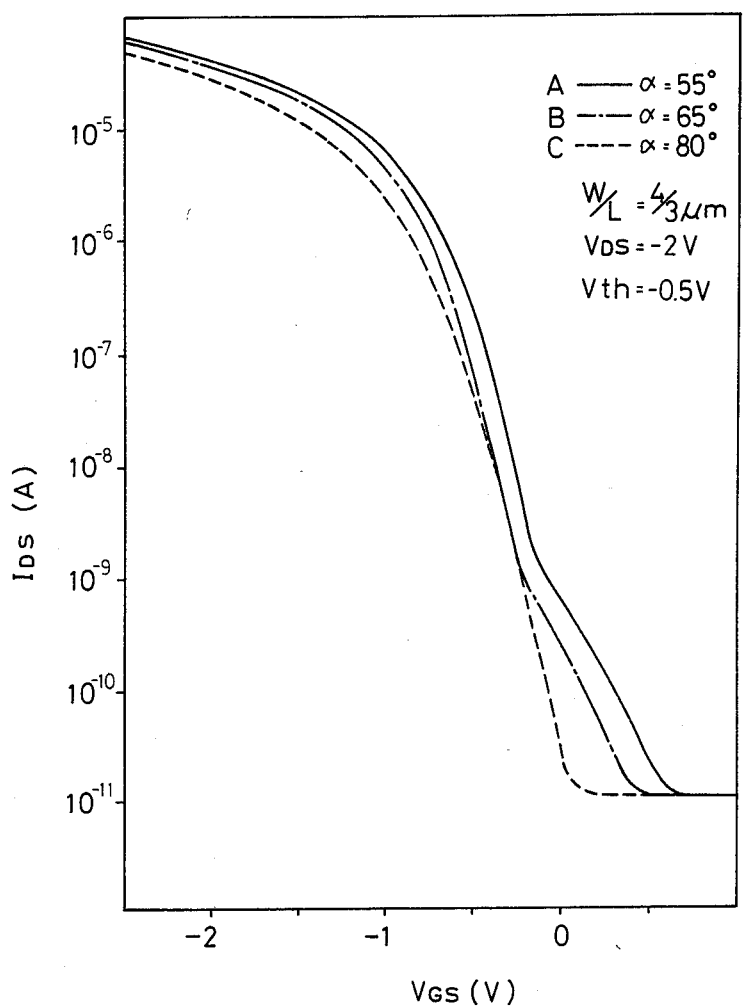
FIG. 5 is a graph showing gate voltage and drain current characteristics of SOS-MOS transistors having different values of tapering angle $\alpha$.

FIG. 5 shows the relationship between gate voltage $V_{GS}$ and drain current $I_{DS}$ of MOS transistors fabricated on the silicon single crystal thin film formed by the above method. As seen from the graph, when $V_{GS}$ is zero volts, as the tapering angle $\alpha$ increases, $I_{DS}$ decreases. That is, as the tapering angle $\alpha$ increases, abnormal drain current caused by the plane of (1 1 1) decreases.

Figure 6:
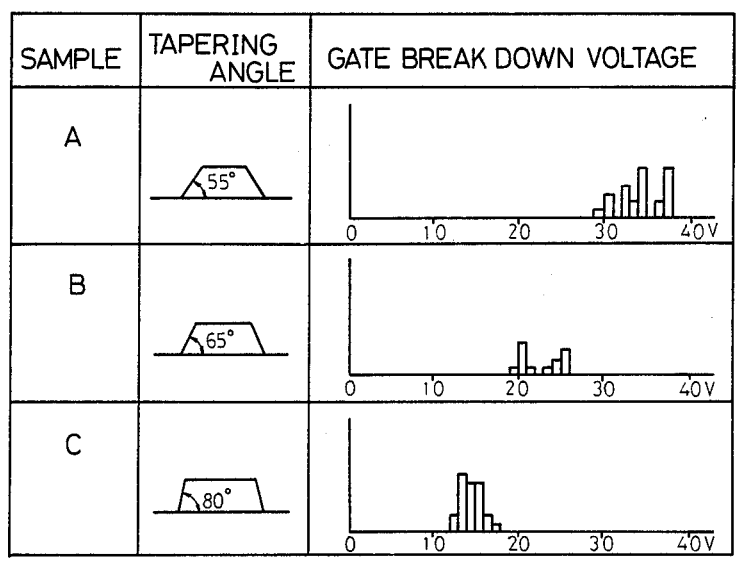
FIG. 6 shows graphs of gate breakdown voltages dependent on tapering angle $\alpha$ of SOS-MOS transistors.

On the contrary, as shown in FIG. 6, as the tapering angle $\alpha$ increases, gate breakdown voltage decreases. The deterioration of the gate breakdown voltage is caused by the fact that a gate insulating layer is extremely thin at a border between the sapphire substrate and silicon single crystal thin film. In order to prevent the deterioration of the gate breakdown voltage, a small tapering angle $\alpha$ is preferable at a portion adjacent to the sapphire substrate surface.

On the other hand, in order to reduce the abnormal drain current by the plane of (1 1 1) of the silicon single crystal, a large tapering angle $\alpha$ is preferable.

Figure 7:
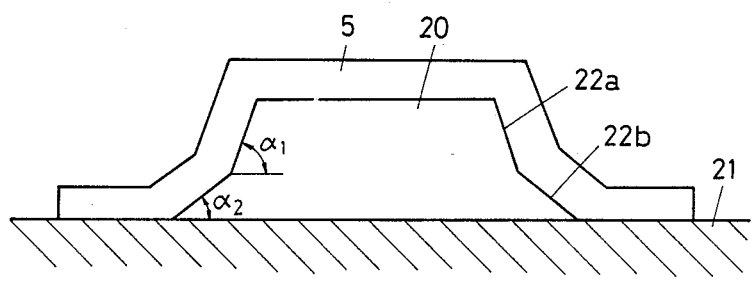
FIG. 7 is a side view showing an embodiment of the present invention.

In accordance with the present invention, as shown in FIG. 7, etching process is performed to have a large tapering angle $\alpha_1$ at a portion 22a adjacent to the surface of the silicon single crystal thin film and to have a small tapering angle $\alpha_2$ at a portion 22b adjacent to the sapphire substrate. It is preferable that the portion 22a occupies a large part of the thickness of the film.

Considering the occupied area of the device, characteristics of gate voltage and drain current, and gate breakdown voltage of the MOS transistor, it is desirable that a tapering angle $\alpha_1$ of 65° or more is formed at a part at least more than half thickness from the surface of silicon single crystal thin film and a tapering angle $\alpha_2$ of 55° or less is formed at the residual thickness.

In accordance with the present invention, it is possible to manufacture an SOS device having lower power consumption with a proper gate breakdown voltage at a low manufacturing cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for semiconductor integrated circuits having a silicon single crystal film formed on a sapphire substrate by hetero epitaxy and isolated islands having side planes, wherein one of said side planes makes an angle of 65° or more with the surface of said sapphire substrate at a part at least more than half thickness from the surface of said silicon single crystal film and makes an angle of 55° or less at a residual thickness.

2. The device according to claim 1 wherein said silicon single crystal film constitutes a MOS transistor.

* * * * *